United States Patent [19]

Singh

[11] 4,278,195

[45] Jul. 14, 1981

[54] METHOD FOR LOW TEMPERATURE BONDING OF SILICON AND SILICON ON SAPPHIRE AND SPINEL TO NICKEL AND NICKEL STEEL AND APPARATUS USING SUCH A BONDING TECHNIQUE

[75] Inventor: Gurnam Singh, Willow Grove, Pa.

[73] Assignee: Honeywell Inc., Minneapolis, Minn.

[21] Appl. No.: 965,350

[22] Filed: Dec. 1, 1978

[51] Int. Cl.³ ................ B23K 35/28; H05K 5/06
[52] U.S. Cl. ................ 228/123; 228/263 A; 228/263 B; 228/124; 174/50.61
[58] Field of Search ................ 228/122–124, 228/263 A, 263 B; 73/141 A; 29/589; 174/50.61

[56] References Cited

U.S. PATENT DOCUMENTS

| 3,396,454 | 8/1968 | Murdock et al. ........... 228/263 A X |
| 3,551,997 | 1/1971 | Etter ........................... 228/263 A X |
| 3,555,669 | 1/1971 | Tarn ............................ 228/123 X |
| 3,665,594 | 5/1972 | Raithel ......................... 228/123 X |
| 3,678,568 | 7/1972 | Knippenberg et al. ..... 228/263 A X |
| 3,728,090 | 4/1973 | Hoffman et al. ............ 228/263 A X |
| 3,795,041 | 3/1974 | Hennicke et al. ........... 228/263 A X |
| 3,956,821 | 5/1976 | Martin .......................... 228/123 X |

Primary Examiner—Milton S. Mehr
Attorney, Agent, or Firm—Laurence J. Marhoefer; Lockwood D. Burton; Mitchell J. Halista

[57] ABSTRACT

A method for low temperature bonding of silicon and silicon on sapphire and spinel to nickel and nickel steel using a layered structure with an aluminum interface between the nickel or nickel steel and the silicon. The bonding is achieved in a reducing atmosphere using a temperature of 640 to 650 degrees C. with a pressure of 100 to 150 psi on the layered structure for a period of approximately five minutes with a subsequent cooling to avoid strains in the bond. An example of the transducer apparatus utilizing such a bonding technique includes a nickel steel housing and a silicon on spinel transducer wafer having a silicon peripheral pad with an aluminum layer bonding the silicon pad to the nickel steel housing.

10 Claims, 5 Drawing Figures

METHOD FOR LOW TEMPERATURE BONDING OF SILICON AND SILICON ON SAPPHIRE AND SPINEL TO NICKEL AND NICKEL STEEL AND APPARATUS USING SUCH A BONDING TECHNIQUE

BACKGROUND OF THE INVENTION

1. Field of the Invention

The present invention relates to bonding techniques. More specifically, the present invention is directed to a method for bonding silicon to nickel and a transducer apparatus utilizing such a bonding technique.

2. Description of the Prior Art

The development of transducers such as those shown in U.S. Pat. Nos. 3,230,763 and 3,537,319 has led to a composite structure using silicon on sapphire (SOS). The sapphire with a silicon epitaxial layer grown on it may be used for pressure transducers and provides, in effect, strain sensitive resistors. The strain sensitive elements are shaped on the sapphire wafer by a suitable etching process with the resulting wafer being cut into a desired configuration by a diamond saw. A recent development has taken advantage of an improved stress transmission characteristic which is produced by having the composite transducer structure utilize silicon on spinel. Such a structure results in a superior transducer while retaining its electrical insulating characteristics. The production of such silicon on sapphire and silicon on spinel is a well-known technique and is discussed in the *Journal of Crystal Growth* (1971) in an article by G. W. Cullen on pages 107 to 125 entitled "The preparation and Properties of Chemically Vapor Deposited Silicon on Sapphire and Spinel." In both of these structures the composite end product must be ultimately bonded to a metal support or transducer housing in order to produce a viable transducer. The poor wettability of spinel and sapphire by many metals is well-known and offers a serious problem to the bonding of these materials to metals as well as to ceramics and glasses. One prior art attempt to bond sapphire to metal involved the growing of multiple metallic layers on one or both of the elements and then fusing them together at relatively high temperatures. However, the high temperatures involved can damage the strain elements deposited on the sapphire. On the other hand, the bonding of silicon on spinel to metal remains a problem which has limited the use of the corresponding composite transducer in a useful product.

SUMMARY OF THE INVENTION

An object of the present invention is to produce a method for bonding silicon to nickel.

Another of the present invention is to produce an improved transducer apparatus utilizing a novel method of bonding of silicon to nickel.

In accomplishing these and other objects, there has been provided, in accordance with the present invention, a low temperature bonding method for bonding silicon to nickel by introducing therebetween a layer of aluminum and subjecting the layered structure to a pressure of 100 to 150 psi at a temperature of 640 to 650 degrees C. for a period of approximately five minutes in a reducing atmosphere. An example of a transducer apparatus utilizing such a bonding technique includes a nickel steel housing and a silicon on spinel transducer wafer having silicon peripheral pads with an aluminum layer bonding the silicon pads to the nickel steel housing.

BRIEF DESCRIPTION OF THE DRAWINGS

A better understanding of the present invention may be had when the following description is read in connection with the accompanying drawings in which.

DESCRIPTION OF THE PREFERRED EMBODIMENT

Detailed description

Figure 1:
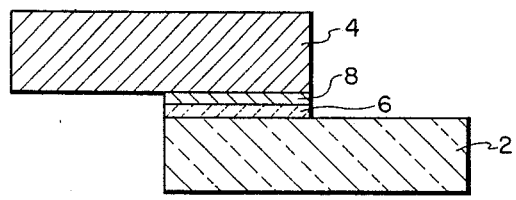
FIG. 1 is a cross-section of a silicon to nickel material bond showing an example of the present invention.

Referring to FIG. 1 in more detail, there is shown an example of a material bond utilizing the method of the present invention between a sapphire or spinel material layer 2 and a nickel based steel material layer 4. The material bond includes a silicon layer 6 and an aluminum layer 8. Specifically a layer of silicon 6, e.g., three to four millimeters thick, is grown by any conventional means on the layer 2. A thin aluminum layer 8, e.g., one or two millimeters thick, which may be in the form of an aluminum preform, is introduced between the silicon layer 6 and the nickel steel layer 4. The layered assembly is then subjected to a temperature of 640 to 650 degrees C. under a pressure of 100 to 150 psi for a period of approximately five minutes in a reducing atmosphere such as $H_2$ or $N_2$ followed by a slow cooling to avoid bond strains. The aluminum layer 8 forms a eutectic bond within the nickel in the nickel steel layer 4 and with the silicon layer 6. This bond provides a successful attachment or bond of the spinel or sapphire layer 2 to the nickel steel layer 4 which has a coefficient of thermal expansion comparable to spinel, sapphire and silicon while being easily brazed, welded and machined. Examples of a suitable nickel steel are Carpenter Low Expansion "42" and Carpenter Glass Sealing "42". It should be noted that the layer 2 may be a ceramic or glass layer with the silicon layer 6 deposited thereon.

Figure 2:
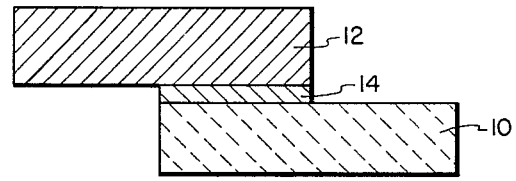
FIG. 2 is another example of a material bond showing a cross-section of another example of the present invention.

In FIG. 2, there is shown another example of a bond also utilizing the technique of the present invention wherein the bond is achieved between a self-supporting silicon layer 10 and a nickel based steel layer 12. An aluminum layer 14 is introduced between the silicon layer 10 and the nickel steel layer 12, and the molding technique is performed as described above with respect to FIG. 1.

Figure 3:
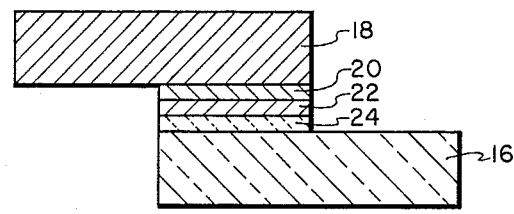
FIG. 3 is a cross-section of a material bond showing another example of the present invention.

In FIG. 3, there is shown another example of a bond utilizing the method of the present invention for bonding a silicon layer 16 to either a non-nickel steel or ceramic or glass layer 18. The non-nickel layer 18 may consequently be of a composition which is not suitable for direct bonding as discussed above with respect to FIGS. 1 and 2. Accordingly, a nickel layer 20, e.g., one to three millimeters thick, is deposited on the material layer 18 prior to the bonding operation. Similarly, a silicon layer 24 is deposited on the spinal, sapphire, or other ceramic and glass layer 16. Finally, the aluminum layer 22 is introduced between the nickel layer 20 and the silicon layer 24, and the bonding method is performed as discussed above with respect to FIGS. 1 and 2.

Figure 4:
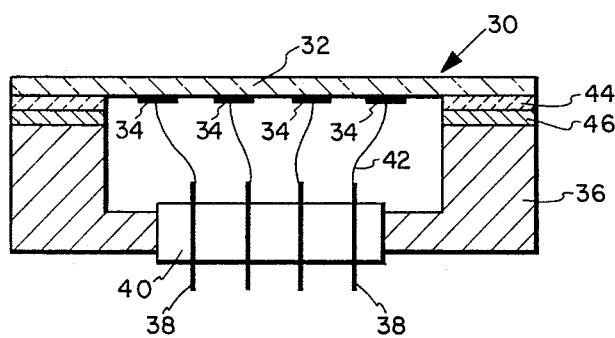
FIG. 4 is a cross-sectional illustration of a transducer utilizing the material bond shown in FIGS. 1 to 3.

In FIG. 4, there is shown an example of a transducer apparatus utilizing the bonding techniques discussed above with respect to FIGS. 1, 2 and 3. A sensor element 30 which may include a silicon or sapphire layer 32 having a plurality of strain sensitive elements 34 arranged on the surface thereof is bonded by the method of the present invention to a transducer housing 36. The strain sensitive elements 34 are electrically connected to respective ones of a plurality of connecting pins 38 which are supported in a header body 40. The header body 40 is arranged to hermetically seal the center portion of the pins 38 and to provide a similar hermetic seal to an opening in the transducer housing 36. The strain sensitive elements 34 are connected by respective electrically conductive wires 42 to the pins 38. The strain sensitive elements 34 are arranged on the underside, or inner side, of the layer 32 whereby the strain sensitive elements 34 are located within the transducer housing 36 and the outer surface of the layer 32 is exposed to the process to be monitored.

The peripheral edge of the layer 32 is bonded to a support edge of a housing 36 using the method of the present invention. Specifically, assuming the housing 36 is a nickel based steel housing and that the layer 32 is a sapphire or spinel layer, a peripheral ring of silicon 44 is deposited on the layer 32. Subsequently, an aluminum ring 46 is placed on the support end of the housing 36 and the layer 32 is positioned with the silicon ring 44 in contact with the aluminum ring 46. The outer layer 32 is than bonded to the transducer housing 36 using the technique discussed above with respect to FIG. 1. The transducer housing is, accordingly, an hermetically sealed structure with the sapphire or spinel on outer layer 32 being exposed to the process while the strain sensitive elements 34 and the electrically conductive wires 42 are protected within the transducer housing 36.

Figure 5:
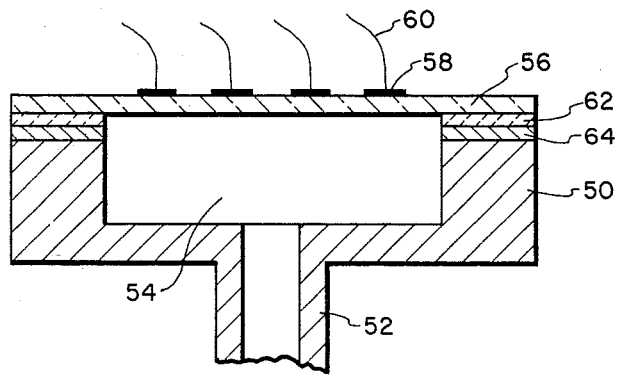
FIG. 5 is a cross-sectional illustration of another example of a transducer utilizing the material bond of FIGS. 1 to 3.

In FIG. 5, there is shown an another example of a transducer apparatus utilizing the bonding technique discussed above with respect to FIG. 1. In this arrangement, the transducer housing 50 is arranged to receive a process pressure to be monitored to an inlet pipe 52 connected to an interior volume 54 of the transducer housing 50. A silicon or sapphire layer 56 is arranged to bridge the internal volume 54 between a circumferential support edge of the transducer housing 50. A plurality of strain sensitive elements 58 with connecting wires 60 are arranged on the outer surface of the layer 56. A peripheral edge of the layer 56 is provided with a silicon layer 62 and an aluminum ring 64 is positioned on the support edge of the housing 50 beneath the silicon layer 62. The transducer housing is than bonded to the layer 56 using the technique discussed above with respect to FIG. 1. While the example of the transducers shown in FIGS. 4 and 5 have been limited to a structure wherein the bonding technique is that of the example shown in FIG. 1, it is to be noted that other transducer structures and materials may be used wherein the bonding techniques of FIGS. 2 and 3 may be more suitable.

Accordingly, it may be seen that there has been provided, an improved bonding technique for bonding silicon to nickel and a transducer apparatus utilizing such a bonding method.

The embodiments of the invention in which an exclusive property or privilege is claimed are defined as follows:

1. A method for bonding nickel to silicon comprising the steps of providing an aluminum layer between an overlapping area of a nickel layer and a silicon layer, pressing the composite layered structures together under a pressure of approximately 100 psi and subjecting the compressed structure to a temperature of approximately 640 degrees C. in a reducing atmosphere for approximately five minutes.

2. A method for bonding as set forth in claim 1 wherein said layered aluminum is approximately two millimeters thick.

3. A method for bonding as set forth in claim 1 wherein said reducing atmosphere may be taken from the group including $H_2$ and $N_2$.

4. A transducer comprising
a process responsive layer,
a support for said layer,
a bonding layer between said responsive layer and said support including a nickel layer attached to said support, a silicon layer attached to said responsive layer and an aluminum layer between said silicon layer and said nickel layer.

5. A transducer comprising
a process responsive layer including a sapphire or spinel substrate,
a transducer housing providing a support edge for said layer,
a nickel layer on said support edge,
an aluminum layer on said nickel layer and
a silicon layer on said aluminum layer and attached to said responsive layer.

6. A transducer comprising
a process responsive layer including a sapphire or spinel substrate,
a transducer housing of a nickel based alloy and providing a support edge for said layer,
an aluminum layer on said support edge and
a silicon layer on said aluminum layer and attached to said responsive layer.

7. A method for bonding nickel to silicon comprising the steps of providing an aluminum layer between an overlapping area of a nickel layer and a silicon layer, compressing the composite layered structure together under a moderate compressive force, and subjecting the compressed structure to a reducing atmosphere and a temperature adequate to form an eutectic bond between the aluminum and the nickel and between the aluminum and the silicon in a reducing atmosphere.

8. A method as set forth in claim 7 wherein said temperature is approximately 640 degrees C.

9. A method for bonding a sapphire or spinel layer to nickel steel comprising the steps of depositing a silicon layer on the sapphire or spinel, providing an aluminum layer between an overlapping area of the nickel steel and the silicon layer, compressing the composite layered structure under a moderate compressive force and subjecting the compressed structure to a reducing atmosphere and a temperature adequate to form an eutectic bond between the aluminum and the nickel steel and between the aluminum and the silicon.

10. A method as set forth in claim 9 wherein said temperature is approximately 640 degrees C.

* * * * *